(12) United States Patent
Lin et al.

(10) Patent No.: US 11,362,050 B2
(45) Date of Patent: Jun. 14, 2022

(54) MULTI-CHIP PACKING STRUCTURE EMPLOYING MILLIMETER WAVE

(71) Applicant: Keycore Technology Corp., Zhubei (TW)

(72) Inventors: Wei-Cheng Lin, Zhubei (TW); Shih-Hsiu Tseng, Zhubei (TW); Chien-Jen Hsiao, Zhubei (TW); Chung-Hsin Liu, Zhubei (TW)

(73) Assignee: KEYCORE TECHNOLOGY CORP., Zhubei (TW)

( * ) Notice: Subject to any disclaimer, the term of this patent is extended or adjusted under 35 U.S.C. 154(b) by 107 days.

(21) Appl. No.: 16/732,366

(22) Filed: Jan. 2, 2020

(65) Prior Publication Data
US 2021/0210443 A1 Jul. 8, 2021

(51) Int. Cl.
| | |
|---|---|
| *H01L 23/66* | (2006.01) |
| *H01L 25/18* | (2006.01) |
| *H01L 23/538* | (2006.01) |
| *H01L 23/15* | (2006.01) |
| *H01L 23/00* | (2006.01) |
| *H01Q 1/22* | (2006.01) |
| *H01L 23/498* | (2006.01) |

(52) U.S. Cl.
CPC .............. *H01L 23/66* (2013.01); *H01L 23/15* (2013.01); *H01L 23/49816* (2013.01); *H01L 23/5383* (2013.01); *H01L 23/5385* (2013.01); *H01L 23/5386* (2013.01); *H01L 23/5387* (2013.01); *H01L 24/24* (2013.01); *H01L 25/18* (2013.01); *H01Q 1/2283* (2013.01); *H01L 2223/6611* (2013.01); *H01L 2223/6616* (2013.01); *H01L 2223/6644* (2013.01); *H01L 2223/6677* (2013.01); *H01L 2224/24137* (2013.01); *H01L 2224/24225* (2013.01)

(58) Field of Classification Search
CPC .............. H01L 23/66; H01L 2223/6644; H01L 2223/6677; H01L 25/0652; H01L 25/071; H01L 25/112; H01L 27/24; H01Q 1/2283
See application file for complete search history.

*Primary Examiner* — David A Zarneke
(74) *Attorney, Agent, or Firm* — Bradley J. Thorson; DeWitt LLP

(57) ABSTRACT

A multi-chip packaging structure employing millimeter wave includes a substrate material, a first and a second substrate board and an adhesive layer. The substrate material has a first metal pad. The first substrate board has a first and a second integrated circuit, multiple first metal wirings and multiple second metal pads, which are layer-by-layer stacked and electrically connected. The first and second metal pads are electrically connected via at least one metal lead. The adhesive layer is disposed between the substrate material and the first substrate board. The second substrate board has a third and a fourth integrated circuit, multiple second metal wirings and multiple third metal pads, which are layer-by-layer stacked and electrically connected. The electro-conductive boss blocks are respectively electrically connected with the second and third metal pads. Chips and antennas are integrated to integrate signal height and avoid interference and minify the volume.

8 Claims, 2 Drawing Sheets

MULTI-CHIP PACKING STRUCTURE EMPLOYING MILLIMETER WAVE

BACKGROUND OF THE INVENTION

1. Field of the Invention

The present invention relates generally to a multi-chip packaging structure employing millimeter wave, and more particularly to a multi-chip packaging structure employing millimeter wave, in which multiple chips, antennas and switches are integrated to avoid interference and minify the volume.

2. Description of the Related Art

Nowadays, the semiconductor packaging technique is quite mature. Also, the integrated circuit and chip packaging technique is quite mature. However, in general, with respect to the multiplex part, the chips for different works are still respectively packaged and then arranged on the circuit board. The current handheld device has a quite narrow internal space so that there is no superfluous room for arranging excessive electronic components and circuit board units. Therefore, it is inevitable to integrate the chips or minify the volume of the circuit board to solve the above problem.

Moreover, the chip such as low-noise power amplifier circuits (LNA) is one single chip, surface acoustic wave filters (SAW) and bulk acoustic wave filters (BAW) is one single chip, the antenna is one single chip and the power amplifier circuit is one single chip. In case the above five chips cannot be integrated into one single chip, it will be impossible to solve the problem that the room for arranging the circuit boards is insufficient. Also, it will be impossible to integrate the signal height. This will lead to the problem of signal interference. It is therefore tried by the applicant to provide a multi-chip packaging structure employing millimeter wave to solve the above problems existing in the conventional technique.

SUMMARY OF THE INVENTION

It is therefore a primary object of the present invention to provide a multi-chip packaging structure employing millimeter wave, in which multiple chips, antennas and switches are integrated to avoid interference and minify the volume.

To achieve the above and other objects, the multi-chip packaging structure employing millimeter wave of the present invention includes a substrate material, a first substrate board, an adhesive layer, a second substrate board and multiple electro-conductive boss blocks.

The substrate material has a first face and a second face. The first face has a first metal pad. The first substrate board has a first integrated circuit, a second integrated circuit, multiple first metal wirings and multiple second metal pads, which are respectively layer-by-layer stacked and electrically connected with each other. The first and second metal pads are electrically connected via at least one metal lead. The adhesive layer is disposed between the substrate material and the first substrate board. The second substrate board has a third integrated circuit, a fourth integrated circuit, multiple second metal wirings and multiple third metal pads, which are respectively layer-by-layer stacked and electrically connected with each other. The electro-conductive boss blocks are respectively electrically connected with the second and third metal pads.

By means of the multi-chip packaging structure employing millimeter wave of the present invention, multiple chips, antennas and switches are integrated to avoid interference and minify the volume.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
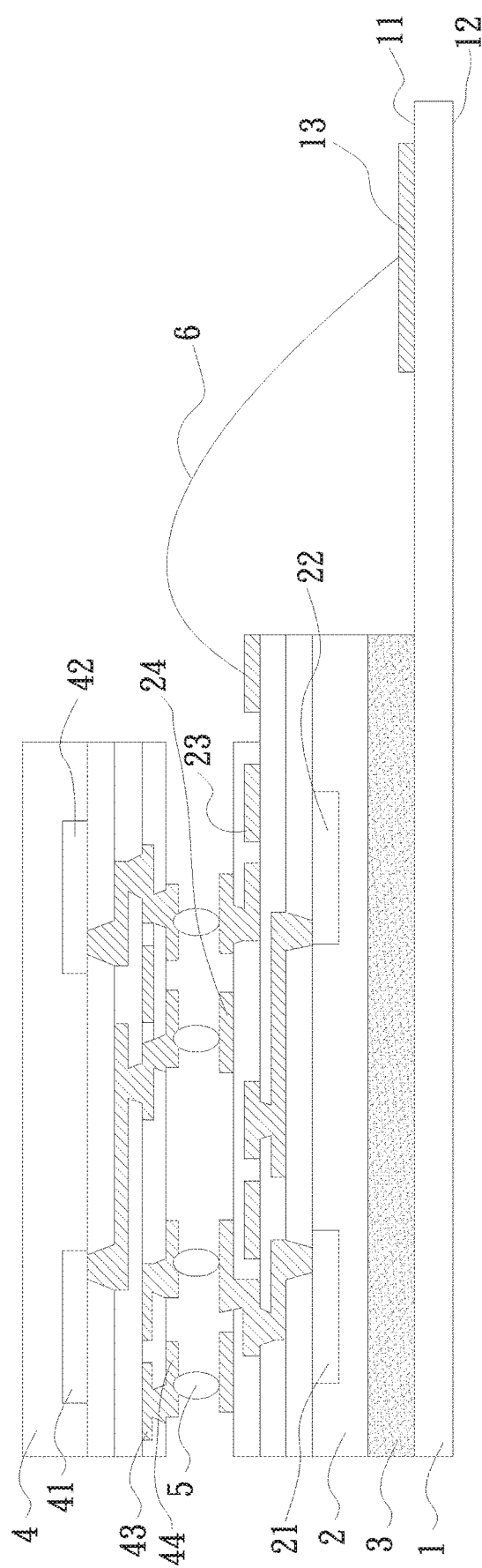
FIG. 1 is a schematic diagram of a first embodiment of the multi-chip packaging structure employing millimeter wave of the present invention.

Please refer to FIG. 1, which is a schematic diagram of a first embodiment of the multi-chip packaging structure employing millimeter wave of the present invention. The multi-chip packaging structure employing millimeter wave of the present invention includes a substrate material 1, a first substrate board 2, an adhesive layer 3, a second substrate board 4 and multiple electro-conductive boss blocks 5.

The substrate material 1 has a first face 11 and a second face 12. The substrate material 1 is a printed circuit board or a flexible printed circuit board. The first face 11 has a first metal pad 13.

The first substrate board 2 has a first integrated circuit 21, a second integrated circuit 22, multiple first metal wirings 23 and multiple second metal pads 24, which are respectively layer-by-layer stacked and electrically connected with each other. The first substrate board 2 is a silicon substrate board. The first and second metal pads 13, 24 are electrically connected via at least one metal lead 6. The first and second integrated circuits 21, 22 are power amplifier circuits or control circuits. The first and second integrated circuits 21, 22, the multiple first metal wirings 23 and the multiple second metal pads 24 are formed by means of etching and respectively layer-by-layer stacked and electrically connected with each other. The first metal wirings 23 are a millimeter antenna.

The adhesive layer 3 is disposed between the substrate material 1 and the first substrate board 2. The adhesive layer 3 is adhesive glue securely bonding the substrate material 1 and the first substrate board 2 to each other.

The second substrate board 4 has a third integrated circuit 41, a fourth integrated circuit 42, multiple second metal wirings 43 and multiple third metal pads 44, which are respectively layer-by-layer stacked and electrically connected with each other. The second substrate board 4 is an insulation material selected from a group consisting of sapphire, glass and quartz glass. The third and fourth integrated circuits 41, 42 are selected from a group consisting of low-noise power amplifier circuits (LNA), surface acoustic wave filters (SAW), bulk acoustic wave filters (BAW), control circuits, multiplexers and switches. The third and fourth integrated circuits 41, 42, the multiple second metal wirings 43 and the multiple third metal pads 44 are formed by means of etching and respectively layer-by-layer stacked and electrically connected with each other. The second metal wirings 43 are a millimeter antenna.

The electro-conductive boss blocks 5 are respectively electrically connected with the second and third metal pads 24, 44. The first and second integrated circuits 21, 22 of the first substrate board 2 and the third and fourth integrated circuits 41, 42 of the second substrate board 4 are signal-connected via the electro-conductive boss blocks 5.

By means of the multi-chip packaging structure employing millimeter wave of the present invention, multiple chips, antennas and switches can be integrated to avoid interference and minify the volume.

Figure 2:
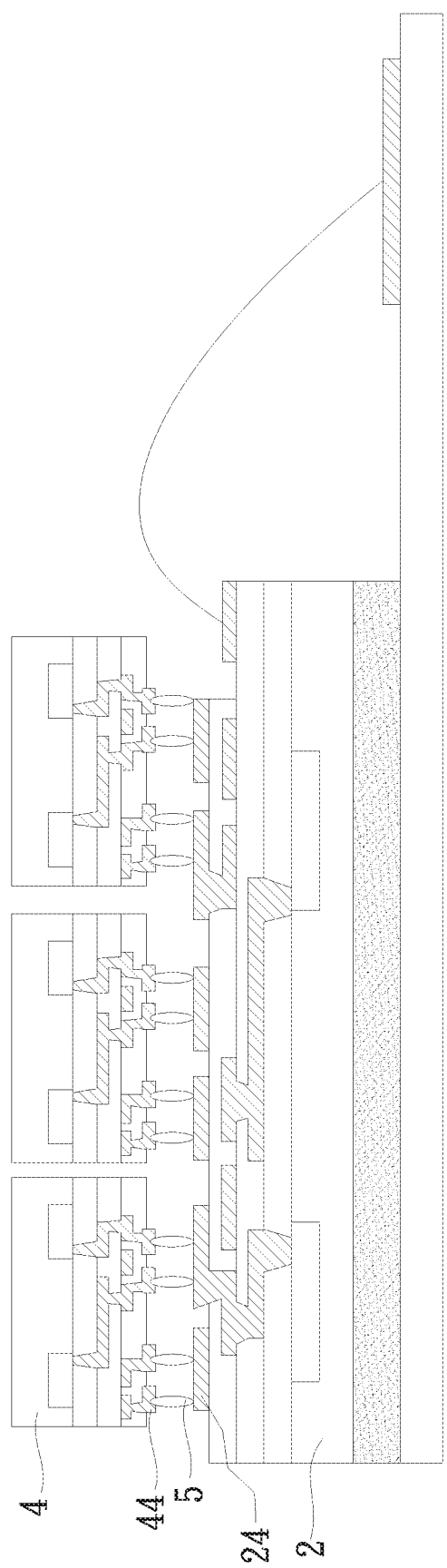
FIG. 2 is a schematic diagram of a second embodiment of the multi-chip packaging structure employing millimeter wave of the present invention.

Please now refer to FIG. 2, which is a schematic diagram of a second embodiment of the multi-chip packaging structure employing millimeter wave of the present invention. The second embodiment is partially identical to the first embodiment in structure and thus will not be redundantly described hereinafter. The second embodiment is different from the first embodiment in that there are multiple second substrate boards 4 horizontally disposed on upper side of the first substrate board 2 in parallel. The third metal pads 44 of the second substrate boards 4 are signal-connected with the second metal pads 24 of the first substrate board 2 via the electro-conductive boss blocks 5.

It is a primary object of the present invention to connect the LNA, the antennas, the SAW, the BAW, the switches and the like chips with the power amplifier chips via the metal boss blocks.

It is a primary object of the present invention to integrate the signal height so as to avoid interference and minify the volume and thus improve the shortcoming of the conventional device.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A multi-chip packaging structure employing millimeter wave, comprising:
    a substrate material having a first face and a second face, the first face having a first metal pad;
    a first substrate board having a first integrated circuit, a second integrated circuit, multiple first metal wirings and multiple second metal pads, which are respectively layer-by-layer stacked and electrically connected with each other, the first and second metal pads being electrically connected via at least one metal lead;
    an adhesive layer disposed between the substrate material and the first substrate board;
    a second substrate board having a third integrated circuit, a fourth integrated circuit, multiple second metal wirings and multiple third metal pads, which are respectively layer-by-layer stacked and electrically connected with each other; and
    multiple electro-conductive boss blocks respectively electrically connected with the second and third metal pads.

2. The multi-chip packaging structure employing millimeter wave as claimed in claim 1, wherein the first and second integrated circuits are power amplifier circuits or control circuits.

3. The multi-chip packaging structure employing millimeter wave as claimed in claim 1, wherein the substrate material is a printed circuit board or a flexible printed circuit board.

4. The multi-chip packaging structure employing millimeter wave as claimed in claim 1, wherein the adhesive layer is adhesive glue.

5. The multi-chip packaging structure employing millimeter wave as claimed in claim 1, wherein the second substrate board is an insulation material selected from a group consisting of sapphire, glass and quartz glass.

6. The multi-chip packaging structure employing millimeter wave as claimed in claim 1, wherein the third and fourth integrated circuits are selected from a group consisting of low-noise power amplifier circuits (LNA), surface acoustic wave filters (SAW), bulk acoustic wave filters (BAW), control circuits, multiplexers and switches.

7. The multi-chip packaging structure employing millimeter wave as claimed in claim 1, wherein the third and fourth integrated circuits, the multiple second metal wirings and the multiple third metal pads are formed by means of etching and respectively layer-by-layer stacked and electrically connected with each other, the second metal wirings being a millimeter antenna.

8. The multi-chip packaging structure employing millimeter wave as claimed in claim 1, wherein the first and second integrated circuits of the first substrate board and the third and fourth integrated circuits of the second substrate board are signal-connected via the electro-conductive boss blocks.

* * * * *